(12) United States Patent
Otte

(10) Patent No.: US 7,995,347 B1
(45) Date of Patent: Aug. 9, 2011

(54) CONFIGURABLE CHASSIS SHELF

(75) Inventor: Christopher J Otte, Hollis, NH (US)

(73) Assignee: Juniper Networks, Inc., Sunnyvale, CA (US)

( * ) Notice: Subject to any disclaimer, the term of this patent is extended or adjusted under 35 U.S.C. 154(b) by 468 days.

(21) Appl. No.: 12/142,992

(22) Filed: Jun. 20, 2008

Related U.S. Application Data

(63) Continuation of application No. 11/141,058, filed on Jun. 1, 2005, now Pat. No. 7,414,852.

(51) Int. Cl.
*H05K 5/00* (2006.01)

(52) U.S. Cl. .............. 361/726; 361/679.02; 361/724; 312/223.1; 312/223.2

(58) Field of Classification Search ............ 361/679.58, 361/725
See application file for complete search history.

(56) References Cited

U.S. PATENT DOCUMENTS

| | | | |
|---|---|---|---|
| 5,761,033 A | 6/1998 | Wilhelm ............... | 361/686 |
| 5,793,614 A * | 8/1998 | Tollbom ............... | 361/732 |
| 6,552,915 B2 * | 4/2003 | Takahashi et al. ..... | 361/796 |
| 6,775,131 B2 * | 8/2004 | Hanson ................ | 361/679.58 |
| 6,824,312 B2 | 11/2004 | McClellan et al. ..... | 385/88 |
| 6,916,190 B2 * | 7/2005 | Joist .................. | 439/160 |
| 7,193,856 B2 * | 3/2007 | Hidaka ................ | 361/725 |
| 7,224,581 B2 | 5/2007 | Garnett et al. ........ | 361/687 |
| 7,414,852 B1 * | 8/2008 | Otte ................... | 361/726 |
| 2002/0006026 A1 | 1/2002 | Takahashi et al. ..... | 361/687 |
| 2002/0131257 A1 | 9/2002 | Agard ................. | 361/796 |

OTHER PUBLICATIONS

Co-pending U.S. Appl. No. 11/141,058, filed Jun. 1, 2005 entitled "Configurable Chassis Shelf," Christopher J. Otte.

\* cited by examiner

*Primary Examiner* — Jayprakash N Gandhi
*Assistant Examiner* — Anthony Q Edwards
(74) *Attorney, Agent, or Firm* — Harrity & Harrity, LLP

(57) ABSTRACT

A chassis shelf may include an upper guide adapted to receive a first edge of a first card and a lower guide adapted to receive a first edge of a second card. The chassis shelf may include an alignment device adapted to align the chassis shelf with respect to a chassis. The chassis shelf may include an attachment device for removably coupling the chassis shelf to the chassis.

19 Claims, 5 Drawing Sheets

CONFIGURABLE CHASSIS SHELF

CROSS-REFERENCE TO RELATED APPLICATIONS

This application is a continuation of prior co-pending U.S. patent application Ser. No. 11/141,058, filed Jun. 1, 2005, entitled "CONFIGURABLE CHASSIS SHELF," the disclosure of which is hereby incorporated by reference herein.

FIELD OF THE INVENTION

Implementations consistent with the principles of the invention relate generally to retaining assemblies in electronic devices, and more particularly, to a configurable chassis shelf for use with cards of an electronic device.

BACKGROUND OF THE INVENTION

Electronic devices may be used in many types of systems and/or applications, such as control systems, data processing systems, medical systems, telecommunication systems and/or communication networks. Electronic devices may include system controllers, servers and/or data acquisition systems, medical imaging systems, central office systems, and/or network devices, such as routers, switches, firewalls, and/or network address translators. For some applications it may be desirable to make electronic devices scalable to accommodate new application requirements. For example, a communication network may be expanded to accommodate new users, modified to accommodate new networking protocols and/or types of data traffic, and/or may be reconfigured in response to network attacks and/or natural disasters.

Scalable electronic devices may be designed to accommodate certain changes. For instance, an electronic device may be configured to include a chassis that accepts removable cards to provide flexibility for accommodating new application requirements. A card may include any device capable of receiving data from another device and/or capable of making data available to another device. Implementations of cards may take the form of removable cards or boards that are configured and adapted for use in an electronic device.

An electronic device may include one or more chassis slots for accepting a removable card having a first size, such as a full sized card, and may include one or more slots for accepting a removable card having a second size, such as a half-height card. An electronic device having the above configuration may provide adequate flexibility in certain situations; however, in other situations the scalability of the electronic device may be inadequate. For example, if accommodating a new application requirement, such as an upgrade, requires a number of half-height cards that exceeds the number of half-height slots, a new electronic device enclosure and/or chassis may be required to deploy the additional capability. Installing a new enclosure/chassis may result in additional cost, additional cooling requirements, and/or additional space requirements. The new chassis may be required even though an existing enclosure/chassis is not fully utilized.

SUMMARY OF THE INVENTION

In accordance with an implementation, a chassis shelf is provided. The chassis shelf may include a first guide adapted to receive a first edge of a first card and a second guide adapted to receive a first edge of a second card. The chassis shelf may include an attachment device for removably coupling the chassis shelf to a chassis.

In accordance with another implementation, a card assembly is provided. The card assembly may include a first card having a first edge, a second edge, and a first mating connector, and a second card having a first edge, a second edge, and a second mating connector. The card assembly may include a chassis shelf adapted to receive the first edge of the first card and the second edge of the second card, where the chassis shelf retains the first card and the second card in a determined arrangement that forms an assembly. The assembly may operatively engage a chassis via a chassis slot.

In accordance with yet another implementation, an electronic device is provided. The electronic device may include a chassis adapted to support a first chassis connector to communicatively couple a first card to the electronic device. The chassis may be adapted to support a second chassis connector to communicatively couple a second card to the electronic device. The chassis may be adapted to support a threaded channel adapted to receive a threaded shaft to support a chassis shelf at a determined position relative to the chassis, the first chassis connector, and the second chassis connector.

In accordance with still another implementation, a chassis shelf is provided. The chassis shelf may include first means for receiving a first portion of a first card and second means for receiving a first portion of a second card. The chassis shelf may include coupling means for removably coupling the chassis shelf to the backplane or midplane. The chassis shelf may include engagement means for operatively engaging a tightening device, where the engagement means is operatively coupled to the coupling means to convey a tightening motion from the engagement means to the coupling means in order to retain the chassis shelf at a determined position with respect to the backplane or midplane when the coupling means is coupled to the backplane or midplane.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Implementations may include a configurable chassis shelf that may be used to install two or more partial-height cards into a full-height chassis opening. For example, two half-height cards may be attached to a configurable chassis shelf such that the two half-height cards occupy a single full-height chassis slot. Implementations of the configurable chassis shelf may allow for efficient use of chassis openings by allowing full-height and/or partial-height cards to be configured in a manner that allows substantially full utilization of chassis openings. Implementations of the configurable chassis shelf may be used with card slots having substantially any orientation, such as horizontal card slots and/or vertical card slots.

Exemplary Electronic Device Configuration

Figure 1:
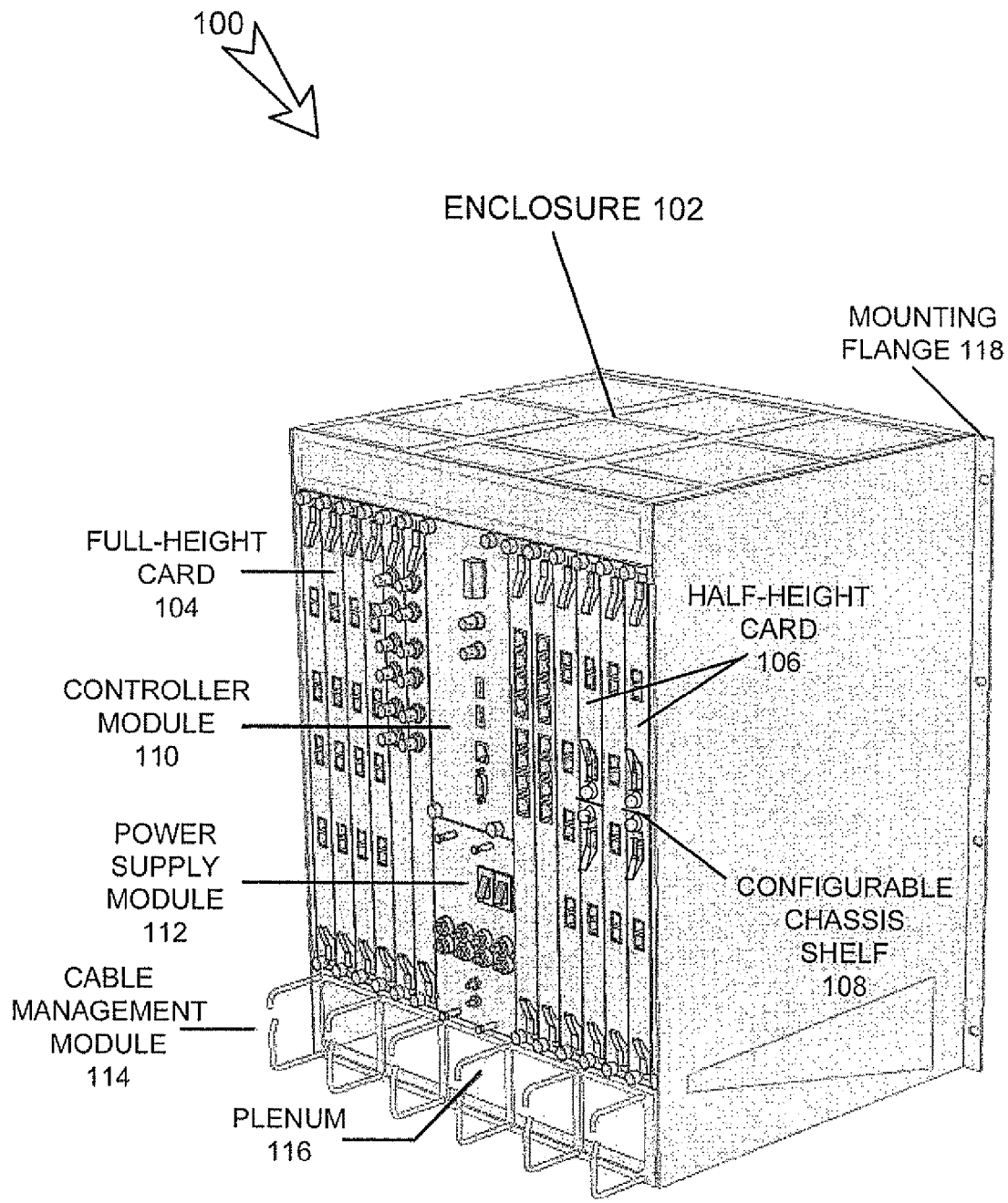
FIG. 1 illustrates an exemplary electronic device capable of accepting a configurable chassis shelf consistent with the principles of the invention.

FIG. 1 illustrates an exemplary electronic device 100 capable of accepting a configurable chassis shelf consistent with the principles of the invention. Electronic device 100 that may include an enclosure 102, a full-height card 104, a half-height card 106, a configurable chassis shelf 108, a controller module 110, a power supply module 112, a cable management module 114, a plenum 116 and a mounting flange 118. In other implementations, electronic device 100 may be configured differently.

Enclosure 102 may include any structure that can be configured to act as a housing to retain and/or protect a chassis, removable cards, and/or other modules that may be used to facilitate operation of electronic device 100. Enclosure 102 may be fabricated from metal, plastic and/or composite and may be sized for particular applications. In one implementation, enclosure 102 may be sized to fit an industry standard mounting structure, such as an equipment rack. Enclosure 102 may include one or more mounting flanges 118 to facilitate attachment of enclosure 102 to a mounting structure, such as an equipment rack. Mounting flange 118 may include one or more mounting holes for accepting fasteners, such as machine screws, for use in attaching electronic device 100 to a mounting structure.

Full-height card 104 and/or half-height card 106 may include any device(s) and/or component(s) that are configured to perform a function while installed in electronic device 100. "Height" as used herein when referring to cards denotes a length associated a card that may be installed in a vertical orientation, a horizontal orientation, and/or another orientation. Full-height card 104 and/or half-height card 106 may be removably coupled to electronic device 100 using fasteners, catches, and/or other retaining mechanisms. Full-height card 104 and/or half-height card 106 may be configured to have a predetermined height and/or depth so as to be retained by a chassis and/or configurable chassis shelf 108 inside electronic device 100. In one implementation, full-height card 104 may have dimensions on the order of approximately 15 inches high by approximately 8 inches deep, and half-height card 106 may have dimensions on the order of approximately 7 inches high by approximately 8 inches deep. Full-height card 104, half-height card 106 and/or other types of partial-height cards may be configured to perform certain functions using a combination of hardware and/or software components. For example, in one implementation, full-height card 104, half-height card 106 and/or other types of partial-height cards may be configured to perform packet forwarding, network address translation, data encryption, data processing, and/or data storage using hardware and/or software components.

Configurable chassis shelf 108 (hereinafter chassis shelf 108) may include any device, mechanism and/or structure that may be configured to couple two or more partial-height cards into an assembly that can be configured and adapted to fit into a chassis slot within enclosure 102. Chassis shelf 108 may have a height on the order of approximately one inch, a width on the order of approximately 1 inch, and a depth on the order of approximately 8 inches.

Controller module 110 may include any device(s) and/or component(s) that are configured to control and/or monitor the operation of one or more cards operating in electronic device 100. Controller module 110 may include a special-purpose computer that can be configured on a full-height card 104 so as to occupy a full-height slot in a chassis within electronic device 100 or may be configured to have a different dimension, such as for mounting in a partial-height card slot or in a dedicated portion of electronic device 100. Power supply module 112 may include any device capable of providing power to devices operating in electronic device 100. Power supply module 112 may be configured to perform voltage and/or current conversion and may include one or more inputs and/or outputs. In one implementation, power supply module 112 may accept an alternating current (AC) from a wall receptacle and provide a direct current (DC) to devices operating within electronic device 100.

Cable management module 114 may include any device, mechanism and/or structure configured to retain and/or manage cables. In one implementation, cable management module 114 may include guides and/or channels for retaining wires and/or optical fibers associated with full-height card 104, half-height card 106, controller module 110 and/or power supply module 112. Plenum 116 may include any device, mechanism and/or structure that facilitates and/or directs airflow through electronic device 100. In one implementation, plenum 116 may include one or more openings, or channels, for accepting an input air volume and directing the input air volume across interior portions of full-height card 104, half-height card 106, controller module 110 power supply module 112, and/or other devices, components and/or cards.

Figure 2:
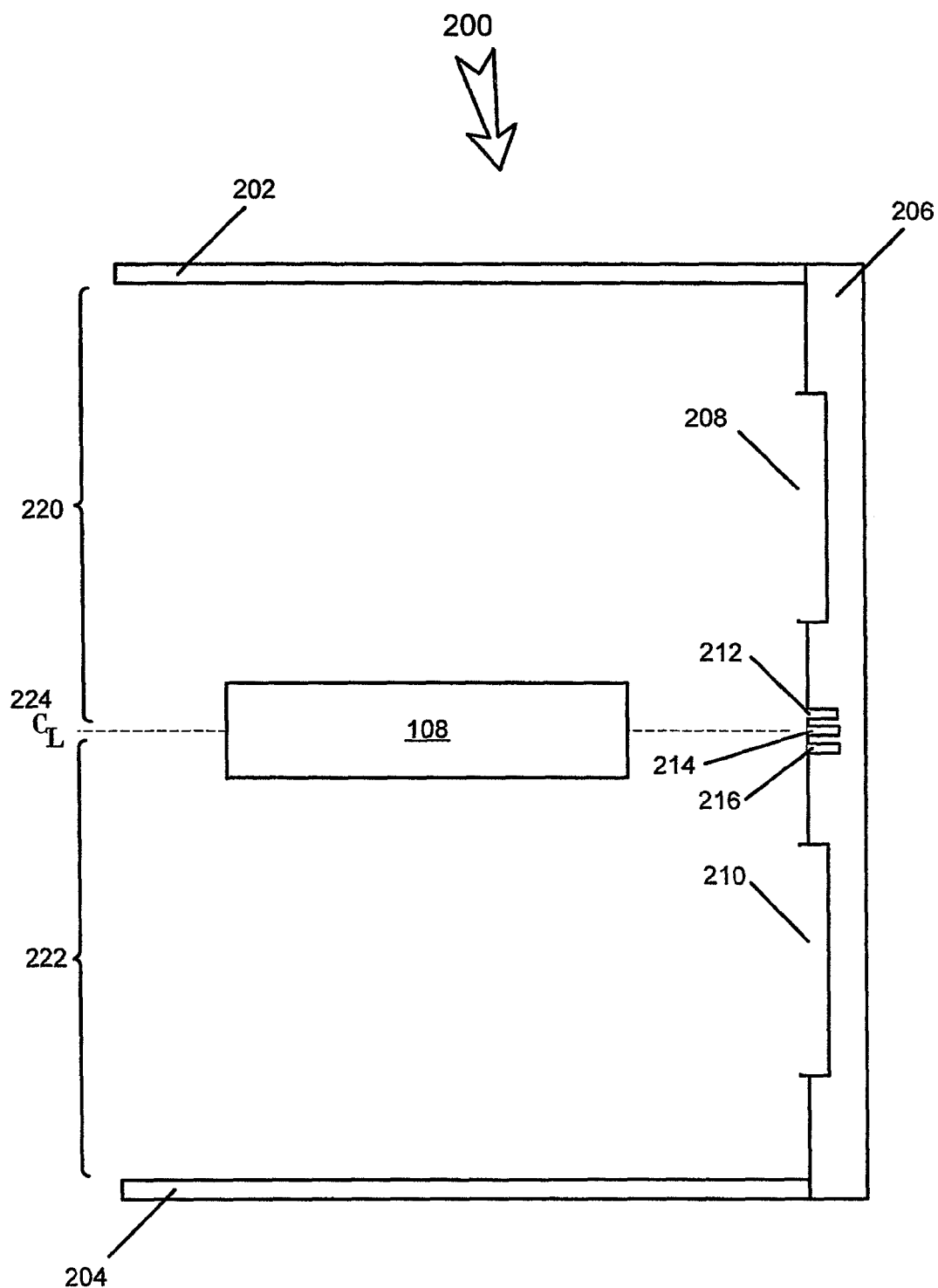
FIG. 2 illustrates a schematic representation of a full height chassis slot configured accept a configurable chassis shelf consistent with the principles of the invention.

FIG. 2 illustrates a schematic representation of a full-height chassis slot that can accept a configurable chassis shelf consistent with the principles of the invention. While the exemplary implementation of FIG. 2 illustrates a chassis slot having a vertical orientation, implementations of the configurable chassis shelf may be used with card slots having other orientations.

FIG. 2 illustrates an implementation of a full-height chassis slot 200 configured to accept a full-height card, such as full-height card 104, or two partial-height cards, such as half-height cards 106, that may be substantially the same height and that may be operating in conjunction with configurable chassis shelf 108. Other implementations may employ two or more partial-height cards that are not the same height, such as might occur when a ⅓-height card and/or a ⅔-height card operate in conjunction with configurable chassis shelf 108. Partial-height card as used herein refers to any card having a height that is less than the height of a full-height card. Partial-height cards may have the same depth, a longer depth and/or a shorter depth than a corresponding full-height card.

Full-height chassis slot 200 may occupy an interior portion of enclosure 102 of electronic device 100 and may include an upper chassis guide 202, a lower chassis guide 204, a back plane/mid plane 206, an upper chassis connector 208, a lower chassis connector 210, an upper alignment channel 212, a threaded channel 214, and a lower alignment channel 216. Chassis shelf 108 may be configured to operate in conjunction with full-height chassis slot 200. Full-height chassis slot 200 may be divided into an upper portion 220 and/or a lower portion 222 via a reference location, such as a center line (CL)

224. In one implementation, full-height chassis slot 200 may be substantially symmetrical about center line 224 such that upper portion 220 and lower portion 222 may be substantially identical. Center line 224 may longitudinally pass through chassis shelf 108 when mounted in full-height chassis slot 200.

Upper chassis guide 202 may include any device, mechanism and/or structure that may retain a portion of a card, such as a full-height card 104 and/or a partial-height card 106. In one implementation, upper chassis guide 202 may include a channel configured and adapted to receive an upper edge of a card. Upper chassis guide 202 may retain the upper edge in a desired position relative to back plane/mid plane 206. Lower chassis guide 204 may be substantially identical to upper chassis guide 202 and may be configured to retain a lower edge of a card in a desired position relative to back plane/mid plane 206.

Backplane/midplane 206 may include any device, mechanism and/or structure that may be configured to support upper chassis guide 202, lower chassis guide 204, upper chassis connector 208, lower chassis connector 210, upper alignment channel 212, threaded channel 214, and/or lower alignment channel 216. Implementations of backplane/midplane 206 may be fabricated from metal and may operate as a ground plane for devices into which full-height chassis slot 200 is installed.

Upper chassis connector 208 may include any device, mechanism and/or structure capable of making electrical and/or optical signals available to a card having a mating connector associated therewith. In one implementation, upper chassis connector 208 may include a multi-pin connector configured and arranged to receive an upper mating connector mounted on a card, such as full-height card 104. When full-height card 104 is seated in full-height chassis slot 200, an upper mating connector on the card may be electrically and/or optically coupled to upper chassis connector 208 so that full-height card 104 may communicate with electronic device 100 and/or other cards installed in electronic device 100. Lower chassis connector 210 may be configured in a manner substantially identical to upper chassis connector 208. Configuring upper chassis connector 208 and lower chassis connector 210 in an identical manner may facilitate the use of two half-height cards in full-height chassis slot 200 in conjunction with chassis shelf 108.

Generally, chassis shelf 108 may include any device, mechanism and/or structure that may be configured to couple two or more cards into an assembly that can be configured and adapted to fit into a chassis slot, such as full-height chassis slot 200, as described in detail below.

Upper alignment channel 212 and/or lower alignment channel 216 may include any device, mechanism and/or structure that may be configured and adapted to receive an alignment post associated with chassis shelf 108. Upper alignment channel 212 and/or lower alignment channel 216 may operate to maintain chassis shelf 108 in a desired position when installed in full-height chassis slot 200. In one implementation, upper alignment channel 212 and/or lower alignment channel 216 may cooperatively operate in conjunction with upper chassis guide 202 and/or lower chassis guide 204 to maintain partial-height cards in a determined position when installed in full-height chassis slot 200.

Threaded channel 214 may include any device, mechanism and/or structure that may be configured and adapted to receive an attachment device, mechanism and/or structure, such as a threaded shaft associated with chassis shelf 108. Threaded channel 214 may receive a threaded shaft associated with chassis shelf 108 to secure chassis shelf 108 against back plane/mid plane 206 when the threaded shaft is engaged with threaded channel 214. Threaded channel 214 may be configured to operate in conjunction with upper alignment channel 212 and/or lower alignment channel 216 to align chassis shelf 108 in a determined position with respect to upper chassis guide 202, lower chassis guide 204 and/or back plane/mid plane 206.

When two partial-height cards are installed in full-height chassis slot 200 using chassis shelf 108, an upper card may occupy upper portion 220 and a lower card may occupy lower portion 222. Chassis shelf 108 may engage a lower edge of the upper card and may engage an upper edge of the lower card. Chassis shelf 108 may align the upper card and the lower card such that an upper edge or the upper card may engage upper chassis guide 202 and a lower edge of the lower card may engage lower chassis guide 204.

Exemplary Configurable Chassis Shelf

Figure 3A:
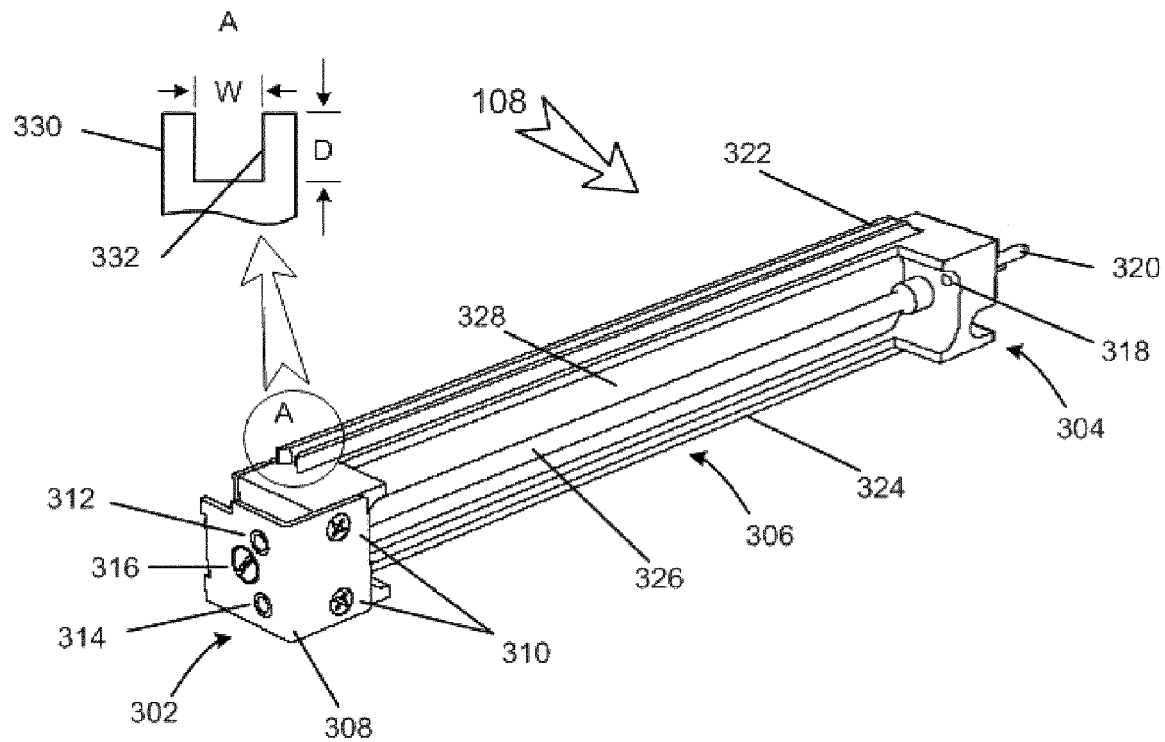
FIGS. 3A and 3B illustrate perspective views of a configurable chassis shelf consistent with the principles of the invention.
Figure 3B:
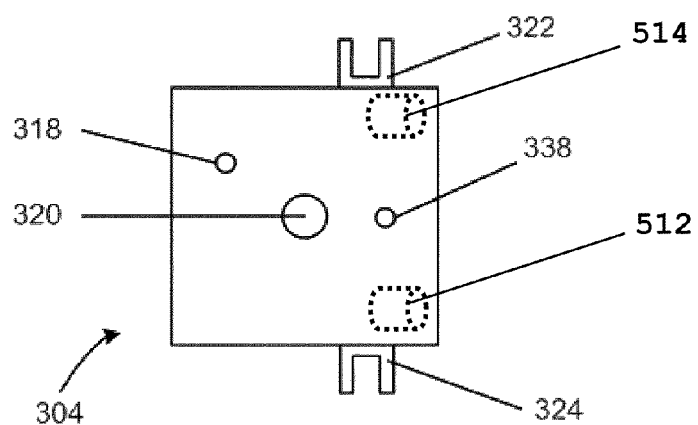

FIGS. 3A and 3B illustrate perspective views of a configurable chassis shelf consistent with the principles of the invention. Chassis shelf 108 may include a front portion 302, a rear portion 304, and a middle portion 306. Front portion 302 may include an angled face plate 308, a pair of face plate screws 310, an upper receptacle 312, a lower receptacle 314, a shaft head 316, a proximal end of an upper guide 322, and a proximal end of a lower guide 324. As shown in FIG. 3B, rear portion 304 may include upper alignment post 318, threaded shaft 320, lower alignment post 338, a distal end of upper guide 322 and a distal end of lower guide 324. Middle portion 306 may include a shaft 326, a middle portion of upper guide 322, a middle portion lower guide 324, and a connecting member 328.

Referring to front portion 302, angled face plate 308 may include any device, mechanism and/or structure that may be configured and dimensioned to retain upper receptacle 312, lower receptacle 314, and shaft head 316. Angled face plate 308 may be dimensioned to receive a lower locking/retaining mechanism associated with an upper card and/or an upper locking/retaining mechanism associated with a lower card. Angled face plate 308 may be attached to chassis shelf 108 using face plate screws 310, other fastening devices and/or fastening techniques, such as rivets, adhesive, and/or welds. Upper receptacle 312 and/or lower receptacle 314 may include any device, mechanism and/or structure that can be configured and dimensioned to receive a threaded portion of a retaining mechanism, such as a thumb screw. Upper receptacle 312 and/or lower receptacle 314 may be identical and may include threaded inserts. Shaft head 316 may include any device, mechanism and/or structure capable of operatively engaging a tightening device such as a screwdriver and/or a wrench. Shaft head 316 may be coupled to a proximal end of shaft 326, and a distal end of shaft 326 may be coupled to threaded shaft 320. When shaft head 316 is rotated in a direction via a tightening device, threaded shaft 320 may rotate in the same direction to engage and/or disengage chassis shelf 108 with/from backplane/midplane 206 via threaded shaft 320.

Front portion 302 may include a proximal end of upper guide 322 as shown by area "A", and a proximal end of lower guide 324. Upper guide 322 may include any device, mechanism and/or structure that can be configured and dimensioned to retain a portion of a card, such as a card edge, in a determined position with respect to chassis shelf 108. Upper guide 322 may include first wall 330 and/or an opposing second wall 332. First wall 330 and/or second wall 332 may be configured and dimensioned to retain a card edge therebetween. First wall 330 and/or second wall 332 may be separated by a width (W) and may, respectively, have a depth (D). In one implementation, width may be on the order of approximately 0.1 inches and depth may be on the order of approximately 0.15 inches; however, other implementations may use different widths and/or depths.

Upper guide 322 may traverse an upper surface of chassis shelf 108 and may terminate proximate to rear portion 304. Lower guide 324 may be substantially identical to upper guide 322 and may traverse a lower surface of chassis shelf 108 and may terminate proximate to rear portion 304. Upper guide 322 and/or lower guide 324 may be arranged substantially along a longitudinal axis passing through the center of chassis shelf 108. Alternatively, upper guide 322 and/or lower guide 324 may be offset from the longitudinal axis (as shown in FIG. 3B).

Referring to middle portion 306 (FIG. 3A), shaft 326 may include any device, mechanism and/or structure capable of operatively coupling shaft head 316 to threaded shaft 320. Connecting member 328 may include any substantially rigid structure capable of coupling to front portion 302 and/or rear portion 304. Front portion 302, rear portion 304 and middle portion 306 may be machined, extruded, cast and/or forged and may be made from metal, plastic and/or composites.

Referring to rear portion 304, first upper alignment post 318 and/or lower alignment post 338 (FIG. 3B) may include any device, mechanism and/or structure that may be configured and dimensioned to engage upper alignment channel 212 (FIG. 2) and/or lower alignment channel 216 when chassis shelf 108 is installed in a chassis slot. Upper alignment post 318 and/or lower alignment post 338 may operate to maintain a determined alignment between chassis shelf 108 and backplane/midplane 206, between an upper card edge of an upper card and upper chassis guide 202, and/or between a lower card edge of a lower card and lower chassis guide 204. Upper alignment post 318 and/or lower alignment post 338 may operate to prevent chassis shelf 108 from rotating about a longitudinal axis passing lengthwise through chassis shelf 108 when installed in full-height chassis slot 200. Upper alignment post 318 and/or lower alignment post 338 may operate alone and/or in conjunction with other alignment devices, mechanisms and/or structures to maintain chassis shelf 108 in a determined position. Threaded shaft 320 may include any device, mechanism and/or structure that may be configured and dimensioned to engage threaded channel 214 to retain chassis shelf 108 in a determined position.

Exemplary Card Assembly

Figure 4:
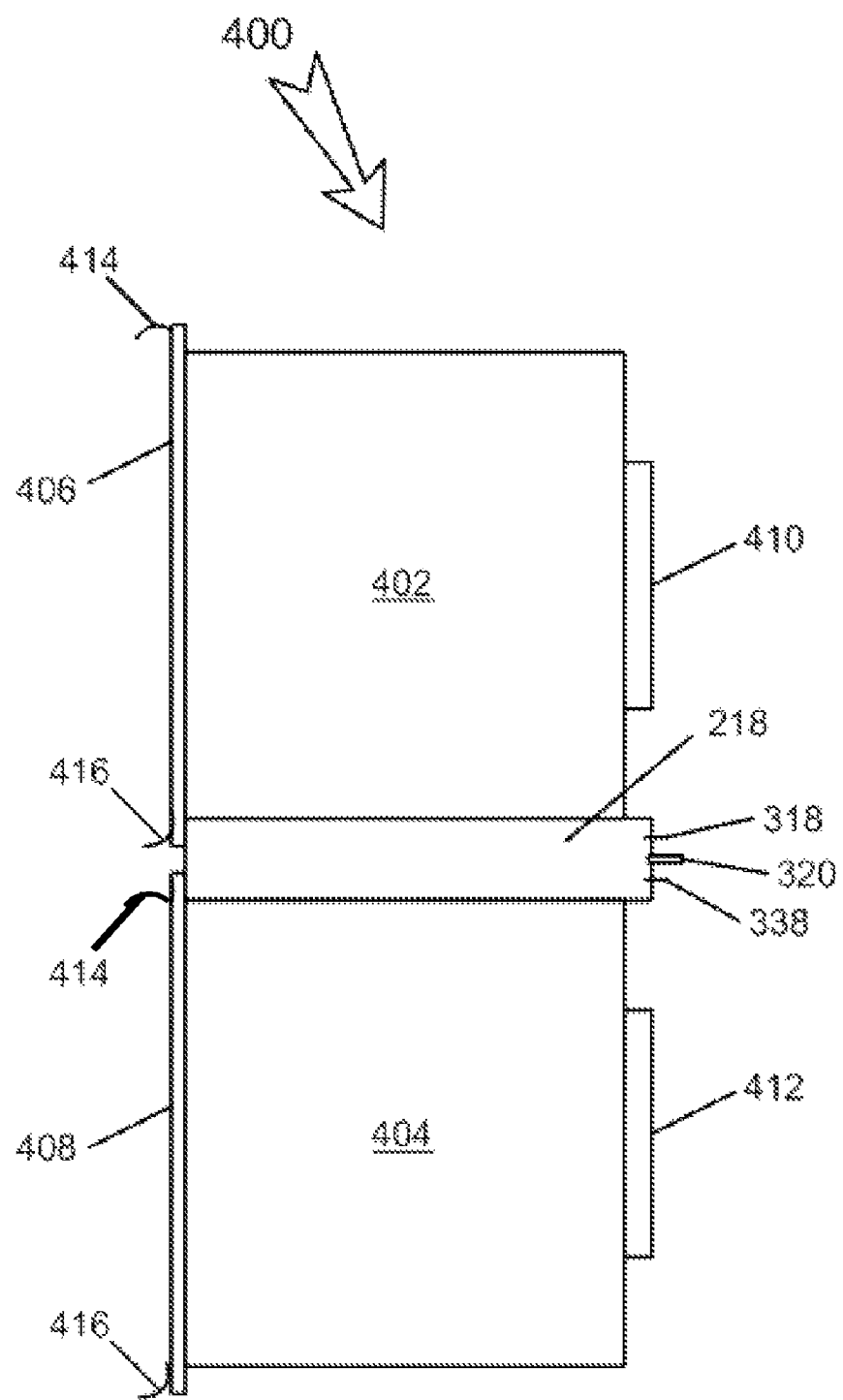
FIG. 4 illustrates a schematic representation of two half-height cards configured and arranged to occupy a full-height chassis slot in conjunction with a configurable chassis shelf consistent with the principles of the invention.

FIG. 4 illustrates a schematic representation of two half-height cards configured and arranged to occupy a full-height chassis slot in conjunction with a configurable chassis shelf consistent with the principles of the invention. Two half-height cards may be releasably coupled to chassis shelf 108 to form a card assembly 400. Card assembly 400 may include chassis shelf 108, upper alignment post 318, threaded shaft 320, lower alignment post 338, an upper card 402, a lower card 404, an upper card face plate 406, a lower card face plate 408, an upper mating connector 410, a lower mating connector 412, an upper locking lever 414, and a lower locking lever 416.

Chassis shelf 108, upper alignment post 318, threaded shaft 320, and/or lower alignment post 338 may be configured as previously described. Upper card 402 and/or lower card 404 may include any card having dimensions such that two or more cards can be joined together into an assembly 400 that may be capable of occupying a chassis slot. In one implementation, upper card 402 and/or lower card 404 may include half-height cards having dimensions on the order of approximately 7 inches high by approximately 8 inches deep. Upper mating connector 410 and/or lower mating connector 412 may include any device, mechanism and/or structure capable of electrically and/or optically coupling upper card 402 and/or lower card 404 to upper chassis connector 208 (FIG. 2) and/or lower chassis connector 210, respectively. Upper mating connector 410 and/or lower mating connector 412 may include multi-pin and/or multi-receptacle connectors capable of conveying electrical and/or optical signals from a source to a destination.

Upper face plate 406 and/or lower face plate 408 may include any device, mechanism and/or structure that may be attached to a card to facilitate removably coupling the card within full-height chassis slot 200, preventing debris from reaching interior portions of full-height chassis slot 200, and/or for receiving fastening devices to facilitate securing a faceplate to a front portion of full-height chassis slot 200 and/or enclosure 102. In one implementation, upper face plate 406 and/or lower face plate 408 may, respectively, include a substantially flat panel having a length sufficient to substantially span from chassis shelf 108 to upper chassis guide 202 and/or from chassis shelf 108 to lower chassis guide 204 (as shown in FIG. 1).

Upper face plate 406 and/or lower face plate 408 may include fastening devices, mechanisms and/or structures, such as upper locking lever 414 and/or lower locking lever 416, for securing upper face plate 406 and/or lower face plate 408 against a front portion of full-height chassis slot 200.

Upper locking lever 414 and/or lower locking lever 416 may include any card seating device, mechanism and/or structure that may be configured to secure upper face plate 406 and/or lower face plate 408 to a front portion of full-height chassis slot 200.

Figure 5:
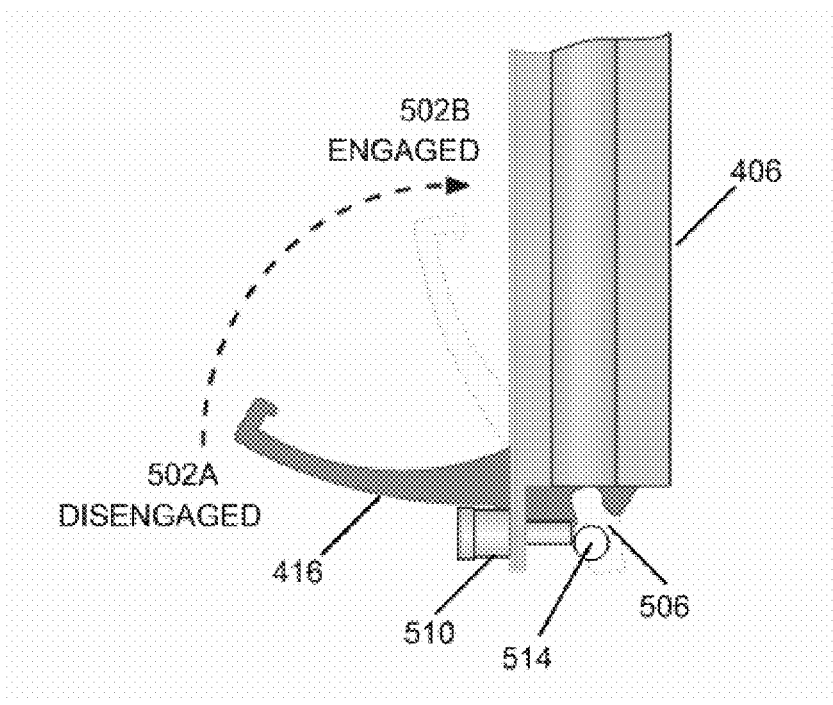
FIG. 5 illustrates a card seating device including an upper locking device and a lower locking device for seating cards in a chassis in conjunction with a configurable chassis shelf consistent with the principles of the invention.
Figure 5:
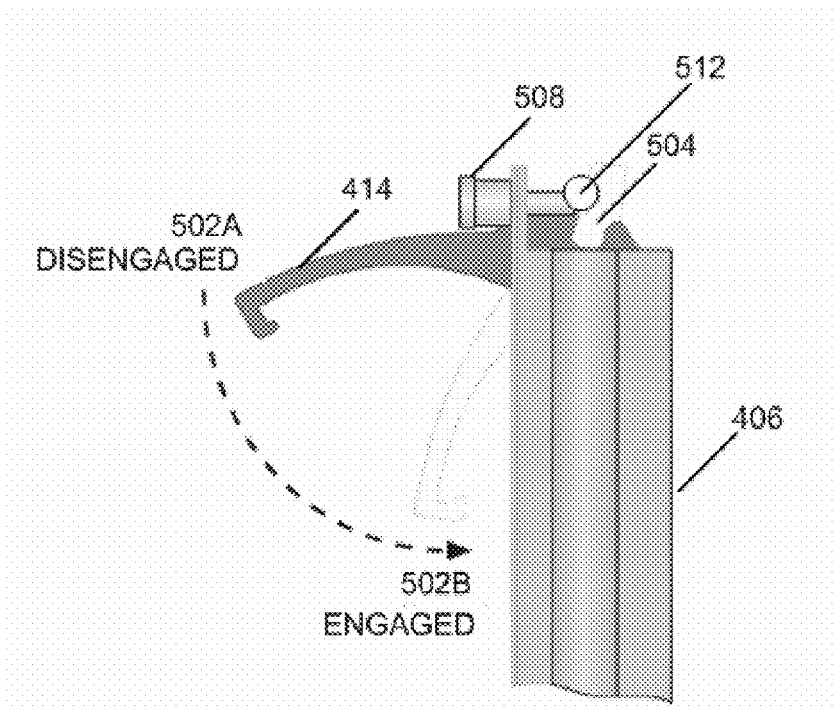

FIG. 5 illustrates a card seating device including an upper locking device and a lower locking device for seating cards in a chassis in conjunction with a configurable chassis shelf consistent with the principles of the invention. The implementation of FIG. 5 may include upper face plate 406, upper locking lever 414, lower locking lever 416, upper recess 504, lower recess 506, upper thumb screw 508, and lower thumb screw 510.

Upper face plate 406 may be substantially similar to the implementation described in conjunction with FIG. 4. Upper locking lever 414 and/or lower locking lever 416 may be pivotally coupled to upper face plate 406 and/or may include a disengaged, or open, position 502A and/or an engaged, or closed, position 502B. When upper locking lever 414 and/or lower locking lever 416 are placed in disengaged position 502A, upper card 402 may be removed from full-height chassis slot 200. Upper card 402 and/or lower card 404 may be removed along with chassis shelf 108 by placing an upper locking lever 414 on upper card 402 in disengaged position 502A and by placing a lower locking lever 416 on lower card 404 in disengaged position 502A so as to release assembly 400 from full-height chassis slot 200.

Upper locking lever 414 may include an upper recess 504 and/or lower locking lever 416 may include a lower recess 506 for engaging an upper mating tab 512 and/or a lower mating tab 514 on full height chassis slot 200 and/or chassis shelf 108. Upper recess 504 and/or lower recess 506 may include any device, mechanism, structure and/or technique capable of securing a card in a chassis in conjunction with upper locking lever 414 and/or lower locking lever 416.

Upper locking lever 414 and/or lower locking lever 416 may cooperatively operate to provide sufficient force so as to engage upper mating connector 410 with upper chassis connector 208 and/or lower mating connector 412 with lower chassis connector 210. In one implementation, upper locking lever 414 and/or lower locking lever 416 may provide on the order of approximately 12 to 24 linear inch pounds of force when in the engaged position. Upper thumb screw 508 and/or lower thumb screw 510 may include any device, mechanism and/or structure capable of securing upper face plate 406 against a front portion of full-height chassis slot 200.

Implementations of chassis shelf 108 may be used in configurations other than the exemplary implementations described above. For example, full-height chassis slot 200 may be configured with three chassis connectors to accommodate ⅓-height boards that may be joined into an assembly using two chassis shelves 108. Implementations may employ a ⅔-height card and a ⅓-height card in conjunction with chassis shelf 108 to form an assembly having a height on the order of that associated with a full-height card.

Implementations may employ assemblies of two or more cards that are communicatively coupled together via a ribbon cable and/or jumper. Cards may communicate via a ribbon cable and/or jumper in addition to, or in lieu of, communicating via connectors associated with full-height chassis slot 200. Chassis shelf 108 may be configured in a dual-width implementation to accommodate a first and second upper card and a first and second lower card. An assembly employing four cards and a dual-width chassis shelf may occupy two full sized chassis shots in an electronic device. Chassis shelf 108 may be configured and adapted to accommodate two or more cards that are installed in substantially any configuration in a chassis slot instead of, or in addition to, vertical and/or horizontal orientations as previously described.

CONCLUSION

Implementations consistent with the principles of the invention make possible efficient and flexible usage of available chassis slots in electronic devices employing removable cards. For example, a single full-height chassis slot may accept two or more partial-height boards joined into a card assembly via a configurable chassis shelf.

The foregoing description of exemplary embodiments of the invention provides illustration and description, but is not intended to be exhaustive or to limit the invention to the precise form disclosed. Modifications and variations are possible in light of the above teachings or may be acquired from practice of the invention.

For example, implementations consistent with the principles of the invention can be implemented using assemblies and parts other than those illustrated in the figures and described in the specification without departing from the spirit of the invention. Parts may be added and/or removed from electronic device 100, full-height chassis slot 200 and/or chassis shelf 108 depending on specific deployments and/or applications. Further, disclosed implementations may not be limited to any specific combination of hardware.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

The scope of the invention is defined by the claims and their equivalents.

The invention claimed is:

1. A device to partition a slot within a chassis, comprising:
    an attachment arrangement to secure a first end of the device to the chassis;
    a receiving arrangement located along a lengthwise portion of the device to accommodate a first card and a second card on opposing sides of the lengthwise portion; and
    a mating tab arrangement provided on an L-shaped, removably attached face plate connected with a second end of the device to engage corresponding recesses in a seating arrangement to seat, in the chassis, at least one of the first card or the second card.

2. The device of claim 1, further comprising:
    an alignment arrangement, located at the first end of the device, to maintain the device at a determined position within the chassis.

3. The device of claim 2, where the alignment arrangement prevents the device from rotating about the lengthwise portion, the alignment arrangement comprising:
    a plurality of alignment posts protruding from the first end of the device to engage corresponding alignment channels formed in the chassis.

4. The device of claim 1, where the mating tab arrangement and the seating arrangement cooperatively provide a force of from about 12 to about 24 linear inch pounds.

5. The device of claim 1, where the attachment arrangement comprises:
    a rotatable shaft to threadably engage a threaded channel of the chassis.

6. The device of claim 5, where a head of the shaft, located at the second end of the device, operatively engages a tightening device.

7. The device of claim 1, where the first end of the device is the only portion of the device to be supported by the chassis.

8. The device of claim 1, where the slot is a full-height chassis slot, and the first end of the device is to attach at a location other than a midpoint of the slot to operatively divide the slot into two unequal portions.

9. The device of claim 1, where the slot is a full-height chassis slot, and the device is to be arranged with at least one other device to divide the slot into a plurality of partial-height slots.

10. A card assembly comprising:
    a plurality of cards, each of the cards having an associated seating device at one end and a connector at an opposing end to connect to a chassis; and
    at least one slot partition member to opposingly retain two of the plurality of cards within a slot of the chassis along a lengthwise portion of each of the two of the plurality of cards, where the slot partition member includes a plurality of mating tabs to engage corresponding recesses in the seating devices to cooperatively seat the connectors to the chassis further comprising an L-shaped, removably attached face plate.

11. The card assembly of claim 10, where a mating tab-seating device pair cooperatively provide a force of from about 12 to about 24 linear inch pounds.

12. A system for partitioning a full-height slot in a chassis into a plurality of partial-height slots, the system comprising:
    one or more components to releasably attach a first end of a device to the chassis within the full-height slot;
    one or more components to opposingly retain a first card and a second card along a lengthwise portion of the device; and
    one or more components to engagingly mate the device to corresponding recesses of a locking member associated with each of the first and second cards to secure at least one of the first card or the second card in the chassis, where the one or more components to engagingly mate are provided on an L-shaped, removably attached face plate located at a second end of the device.

13. The system of claim 12, further comprising:
one or more components to maintain the device at a determined position within the chassis, where the one or more components to maintain are located at the first end of the device.

14. The system of claim 13, where the one or more components to maintain to prevent the device from rotating about the lengthwise portion of the device.

15. The system of claim 12, where the one or more components to engagingly mate and the locking member cooperatively provide a force of from about 12 to about 24 linear inch pounds.

16. The system of claim 12, where the one or more components to releasably attach comprises:
a rotatable shaft to threadably engage a threaded channel of the chassis.

17. The system of claim 12, where the first end of the device is the only portion of the device to be supported by the chassis.

18. The system of claim 12, where the first end of the device is to attach at a location other than a midpoint of the full-height slot, and
where the partial-height slots have different heights.

19. The system of claim 12, where the device is to be arranged with at least one other device to divide the full-height slot into the plurality of partial-height slots.

* * * * *